(12) United States Patent
Tomita

(10) Patent No.: US 11,735,260 B2
(45) Date of Patent: Aug. 22, 2023

(54) SEMICONDUCTOR MEMORY DEVICE

(71) Applicant: Winbond Electronics Corp., Taichung (TW)

(72) Inventor: Yasuhiro Tomita, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/184,961

(22) Filed: Nov. 8, 2018

(65) Prior Publication Data

US 2019/0244663 A1 Aug. 8, 2019

(30) Foreign Application Priority Data

Feb. 7, 2018 (JP) ................................. 2018-019747

(51) Int. Cl.
*G11C 13/04* (2006.01)
*G11C 13/00* (2006.01)

(52) U.S. Cl.
CPC ........ *G11C 13/0069* (2013.01); *G11C 13/003* (2013.01); *G11C 13/004* (2013.01); *G11C 13/0023* (2013.01); *G11C 13/0033* (2013.01); *G11C 13/0035* (2013.01); *G11C 2013/0083* (2013.01); *G11C 2013/0092* (2013.01); *G11C 2211/5641* (2013.01); *G11C 2211/5646* (2013.01); *G11C 2213/79* (2013.01); *G11C 2213/82* (2013.01)

(58) Field of Classification Search
CPC ............ G11C 13/0069; G11C 13/0033; G11C 13/004
USPC ........................................................ 365/148
See application file for complete search history.

(56) References Cited

U.S. PATENT DOCUMENTS

| 9,269,432 | B2 * | 2/2016 | Faraoni | G11C 13/0064 |
| 9,496,033 | B2 * | 11/2016 | Chung | G11C 11/1675 |
| 9,627,056 | B2 | 4/2017 | Park et al. | |
| 2009/0296458 | A1 * | 12/2009 | Lee | G11C 11/56 |
| | | | | 365/163 |

(Continued)

FOREIGN PATENT DOCUMENTS

| CN | 101441890 | 11/2011 |
| JP | 2008041704 | 2/2008 |

(Continued)

OTHER PUBLICATIONS

Hangbing LV, "Evolution of conductive filament and its impact on reliability issues in oxide-electrolyte based resistive random access memory," Scientific Reports, vol. 5: 7764, 2015, pp. 1-6.

(Continued)

*Primary Examiner* — Xiaochun L Chen
(74) *Attorney, Agent, or Firm* — JCIPRNET

(57) ABSTRACT

A semiconductor memory device capable of satisfying multiple reliability conditions and multiple performance requirements is provided. A variable resistance memory of the disclosure makes it possible to write data in a memory array by changing a write condition according to the type of a write command from the outside. If the write command is an endurance-related command, an endurance algorithm is selected and data is written in an endurance storage area. If the write command is a retention-related command, a retention algorithm is selected and data is written in a retention storage area.

18 Claims, 7 Drawing Sheets

(56) References Cited

U.S. PATENT DOCUMENTS

| | | | | |
|---|---|---|---|---|
| 2012/0087182 A1* | 4/2012 | Kim | ................... | G11C 13/0004 |
| | | | | 365/163 |
| 2014/0003142 A1* | 1/2014 | Lee | ....................... | G11C 16/10 |
| | | | | 365/185.03 |
| 2015/0043274 A1* | 2/2015 | Liu | ..................... | G11C 11/5678 |
| | | | | 365/163 |
| 2015/0179254 A1* | 6/2015 | Alrod | ................. | G11C 13/0033 |
| | | | | 365/148 |
| 2015/0193302 A1* | 7/2015 | Hyun | ................... | G11C 29/028 |
| | | | | 714/764 |
| 2015/0194212 A1* | 7/2015 | Faraoni | .............. | G11C 13/0064 |
| | | | | 365/148 |
| 2016/0071582 A1* | 3/2016 | Chung | ................ | G11C 11/1675 |
| | | | | 365/96 |
| 2018/0108404 A1* | 4/2018 | Miura | ................ | G11C 13/0004 |
| 2018/0150233 A1* | 5/2018 | Hanzawa | ................ | G06F 12/16 |
| 2019/0056981 A1* | 2/2019 | Shulkin | ................. | G06F 11/073 |

FOREIGN PATENT DOCUMENTS

| | | |
|---|---|---|
| JP | 2012064286 | 3/2012 |
| TW | I453746 | 9/2014 |
| WO | 2016194175 | 12/2016 |

OTHER PUBLICATIONS

"Office Action of Taiwan Counterpart Application", dated Mar. 19, 2020, p. 1-p. 10.

\* cited by examiner

| | bit line BL | source line SL | word line WL |
|---|---|---|---|
| forming | Vf | GND | + |
| set | + | GND | + |
| reset | GND | + | + |

| write condition | | Endurance algorithm | retention algorithm | high-speed reading algorithm |
|---|---|---|---|---|
| set | pulse width | T_ES | T_RS | T_HS |
| | pulse level | V_ES | V_RS | V_HS |
| reset | pulse width | T_ERS | T_RRS | T_HRS |
| | pulse level | V_ERS | V_RRS | V_HRS | memory array bitmap

| storage area | flag |
|---|---|
| block_0 | 0 |
| block_1 | 1 |
| block_2 | 0 |
| ⋮ | ⋮ |

SEMICONDUCTOR MEMORY DEVICE

CROSS-REFERENCE TO RELATED APPLICATION

This application claims the priority benefit of Japan application serial no. 2018-019747, filed on Feb. 7, 2018. The entirety of the above-mentioned patent application is hereby incorporated by reference herein and made a part of this specification.

BACKGROUND

Technical Field

The disclosure relates to a semiconductor memory device, more particularly, a variable resistance random access memory using a variable resistance element.

Description of Related Art

A variable resistance memory stores data by applying a pulse voltage to a variable resistance element and reversibly and non-volatilely setting the variable resistance element to a high resistance state or a low resistance state. One advantage of the variable resistance memory is that data can be rewritten at a low voltage, so the power consumption is small and the reading time is short (Japanese Laid-open Patent Application No. 2012-64286, Japanese Laid-open Patent Application No. 2008-41704, etc.).

FIG. 1(A) shows a configuration of the bipolar memory array ("Evolution of conductive filament and its impact on reliability issues in oxide-electrolyte based resistive random access memory" Hangbing Lv et. al., Scientific Reports 5, Article number: 7764 (2015)). In the figure, a memory array 10 of 3 rows×3 columns is illustrated. A memory cell MC exemplified here has a so-called 1T×1R configuration having one variable resistance element and one access transistor connected in series thereto.

The variable resistance element is composed of a thin film oxide of a transition metal, such as hafnium oxide ($HfO_x$), and is set or reset according to the polarity and value of the write pulse voltage, for example, in the case of accessing the memory cell MC, the access transistor of the memory cell MC is turned on by the row decoder 20 via the word line WL(n), and the bit line BL(n) and the source line (n) are selected by the column decoder 30. In the case of a write operation, a write voltage corresponding to set or reset is applied to the selected bit line BL(n) and the selected source line (n); and in the case of a read operation, a voltage or current corresponding to the set or reset of the variable resistance element appears on the selected bit line BL(n) and the selected source line (n), and this is detected by the sense circuit.

FIG. 1(B) shows an example of the bias voltages at the time of forming, set, and reset. At the time of forming, a positive forming voltage Vf is applied to the bit line BL, GND is applied to the source line SL, a positive voltage necessary for turning on the access transistor is applied to the word line WL, a current flows in the variable resistance element from the bit line BL toward the source line SL, and the variable resistance element is formed. When the variable resistance element is set, a positive voltage is applied to the bit line BL, GND is applied to the source line SL, a positive voltage is applied to the word line WL, a current flows in the variable resistance element from the bit line BL toward the source line SL, and the variable resistance element is set to the low resistance state. When the variable resistance element is reset, GND is applied to the bit line BL, a positive voltage is applied to the source line SL, a positive voltage is applied to the word line, a current flows in the variable resistance element from the source line SL toward the bit line BL, and the variable resistance element is reset to the high resistance state.

For the variable resistance memory, the required memory reliability conditions (endurance characteristic/retention characteristic/disturb characteristic) may differ depending on the property of the data to be stored. If specifications are made to match a specific reliability condition, the costs may increase due to the excess of specifications, or the specifications may not be achieved.

SUMMARY

The disclosure provides a semiconductor memory device capable of satisfying multiple reliability conditions and multiple performance requirements.

A semiconductor memory device according to the disclosure includes: a memory array including a reversible and non-volatile variable resistance element; and a writing element writing data to the memory array based on a write condition selected according to a type of a write command or an address inputted from outside during a write operation.

In an embodiment, the semiconductor memory device further includes a storage element storing an algorithm specifying the write condition, and the writing element selects the algorithm corresponding to the write command. In an embodiment, a plurality of storage areas corresponding to a plurality of write conditions are set in the memory array, and the writing element writes the data to the storage area corresponding to the write condition. In an embodiment, the write command includes a command oriented to improving reliability. In an embodiment, the write command includes a command oriented to improving a read operation speed. In an embodiment, a plurality of storage areas corresponding to a plurality of write conditions are set in the memory array, and the writing element performs writing based on the write condition set in the storage area corresponding to the address inputted. In an embodiment, the semiconductor memory device further includes a refresh element refreshing data stored in a selected storage area of the memory array. In an embodiment, the refresh element includes rewriting the same data. In an embodiment, the refresh element is executed in response to a command inputted from outside. In an embodiment, the refresh element includes a detection element detecting an indication that the data stored in the storage area is invalid, and executes refreshing in response to a detection result. In an embodiment, the semiconductor memory device further includes a moving element moving data stored in a certain storage area of the memory array to another storage area. In an embodiment, the moving element is executed in response to a command inputted from outside. In an embodiment, the write condition includes a write pulse time applied to the variable resistance element that is selected. In an embodiment, the write condition includes a voltage level of a write pulse applied to the variable resistance element that is selected.

According to the disclosure, since data is written to the memory array based on the write condition selected according to the type of the write command, multiple reliability conditions and multiple performance requirements can be satisfied.

DESCRIPTION OF THE EMBODIMENTS

Next, embodiments of the disclosure will be described in detail with reference to the drawings. However, it should be noted that the drawings may emphasize some parts to facilitate understanding of the disclosure and are not necessarily drawn to the same scale as the actual devices.

Embodiments

Figure 2:
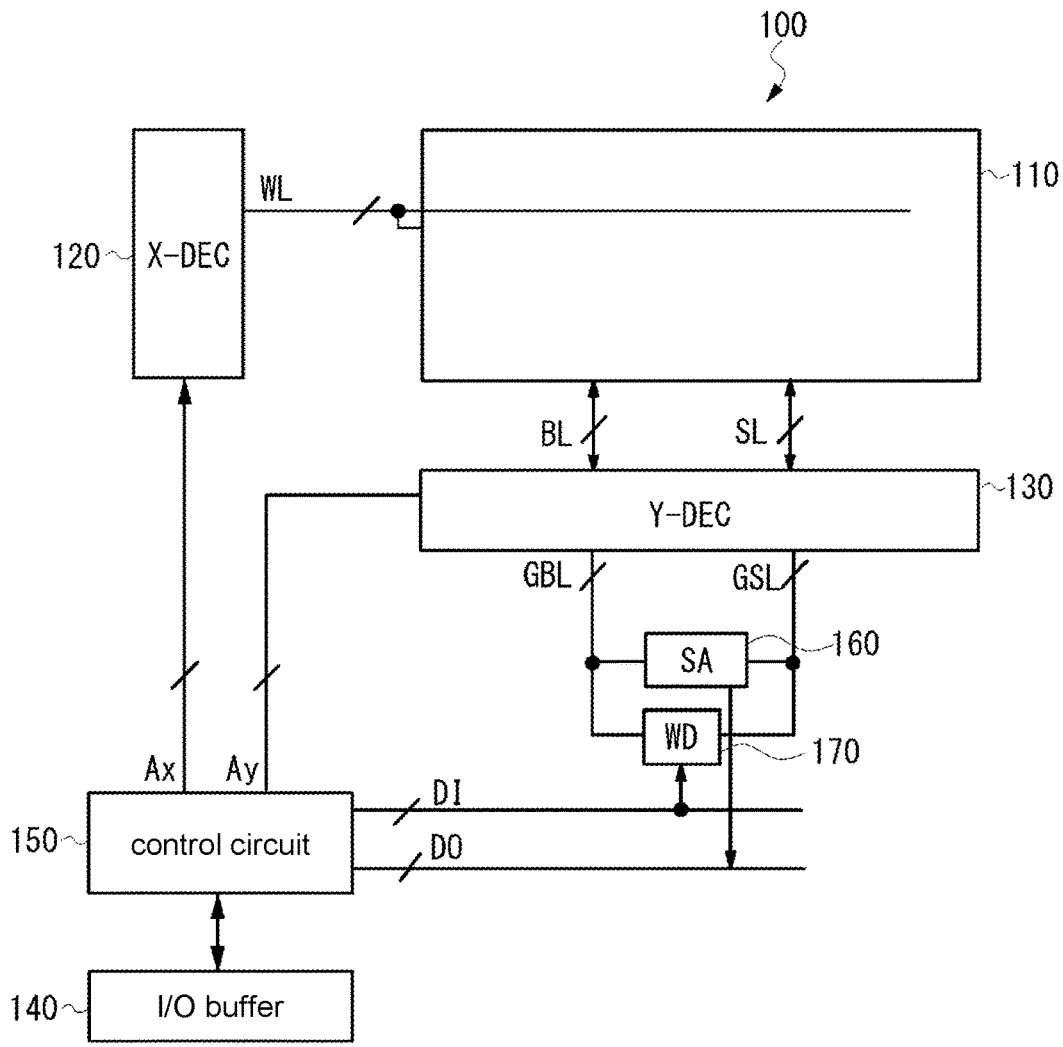
FIG. 2 is a block diagram showing the schematic configuration of a variable resistance random access memory according to an embodiment of the disclosure.

FIG. 2 is a block diagram showing a schematic configuration of a variable resistance random access memory according to an embodiment of the disclosure. The variable resistance memory 100 of the present embodiment includes a memory array 110, a row decoder and drive circuit (X-DEC) 120, a column decoder (Y-DEC) 130, a control circuit 150, a sense amplifier 160, and a write driver/read bias circuit 170. In the memory array 110, a plurality of memory cells including a variable resistance element and an access transistor are arranged in rows and columns. The row decoder and drive circuit (X-DEC) 120 is for selecting and driving the word line WL based on a row address Ax. The column decoder (Y-DEC) 130 is for selecting the bit line BL and the source line SL based on a column address Ay. The control circuit 150 is for controlling each part based on a command, an address, data, etc. received from the outside via an input/output (I/O) buffer 140. The sense amplifier 160 senses the data read from the memory cell via the bit line BL/source line SL. The write driver/read bias circuit 170 is for applying a bias voltage during a read operation via the bit line BL/source line SL and applying a voltage according to set and reset during a write operation.

Figures 1A, 1B:
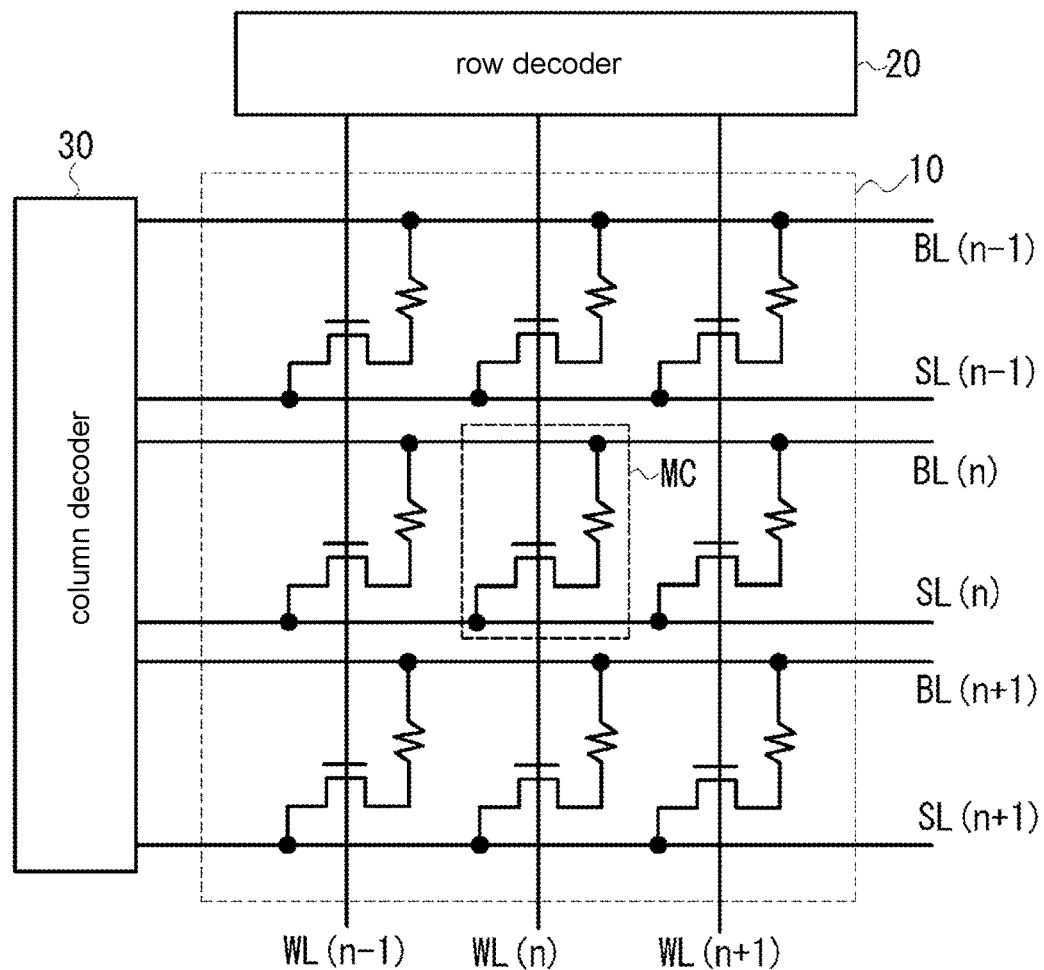
FIG. 1(A) is a diagram showing the array configuration of a conventional variable resistance random access memory.
FIG. 1(B) is a table showing the bias conditions during operation.

As shown in FIG. 1(A), the variable resistance element may have a configuration of 1T×1R, in which one electrode is electrically connected to the bit line and the other electrode is electrically connected to the source/drain of the access transistor, or a configuration of 2T×2R, which includes a pair of access transistors and a pair of variable resistance elements connected in series between a pair of bit lines BL and/BL (bit line bar) and stores complementary data in a pair of variable resistance elements. Each sense amplifier 160 is connected to the control circuit 150 via an internal data bus D0 and the result sensed by the sense amplifier 160 is outputted to the control circuit 150 via the internal data bus D0.

In the case of the configuration of 1T×1R, the sense amplifier 160 compares the voltage or current flowing between the bit line BL and the source line SL of the selected variable resistance element with a reference value to determine data "0" and "1". In the case of 2T×2R, the sense amplifier 160 determines the data "0" and "1" by using a difference signal between the pair of bit lines BL and/BL. In addition, each write driver/read bias circuit 170 is connected to the control circuit 150 via an internal data bus DI, and each write driver/read bias circuit 170 receives write data via the internal data bus DI.

Figure 3:
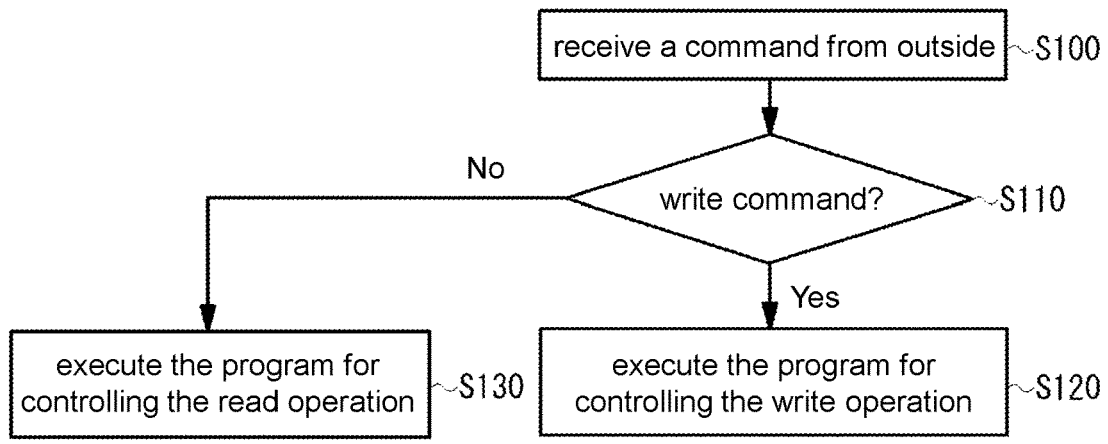
FIG. 3 is a diagram showing an example of the processing sequence of a command according to an embodiment of the disclosure.

The control circuit 150 controls reading and writing based on a command or the like from the outside, such as a host device. In an embodiment, the control circuit 150 includes a central processing unit (CPU) and a ROM/RAM storing a program for controlling a read operation and a write operation. The central processing unit executes the program stored in the ROM according to a command. FIG. 3 shows an example of the processing sequence of a command performed by the central processing unit. When the command is inputted via the I/O buffer 140 (S100), the central processing unit decrypts the command. If the command is a write command (S110), the central processing unit executes a program (algorithm) for controlling the write operation (S120), and if the command is a read command, the central processing unit executes a program (algorithm) for controlling the read operation (S130).

Since the variable resistance memory of the present embodiment satisfies multiple reliability conditions and multiple performance requirements with one single memory, it is possible to deal with multiple write commands and execute a write operation according to each write command. The write command includes a command oriented to improving reliability and a command oriented to increasing the reading speed. The command oriented to improving reliability includes a command oriented to an endurance characteristic of the data (durability of rewriting), a command oriented to a retention characteristic of the data (holding characteristic), or a command oriented to a disturb characteristic at the time of writing, for example.

Figure 4:
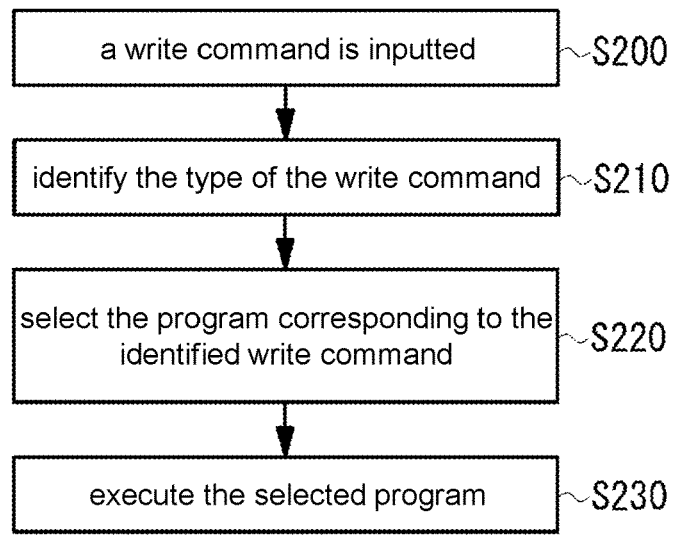
FIG. 4 is a diagram showing an example of the processing sequence of write command processing according to an embodiment of the disclosure.

FIG. 4 shows an example of the processing sequence of the write command performed by the central processing unit. In the case where the inputted command is the write command (S200), the central processing unit identifies the type of the write command (S210), selects a writing program (algorithm) corresponding to the identified write command (S220), and executes the selected writing program (S230).

The present embodiment illustrates an example that the write command includes a write command oriented to the endurance characteristic (hereinafter referred to as endurance-related command), a write command oriented to the retention characteristic (hereinafter referred to as retention-related command), and a write command oriented to the reading speed (hereinafter referred to as high-speed reading-related command).

The endurance characteristic represents the durability (number of times) of data rewriting of the variable resistance element, and the endurance-related command is a command oriented to improving such durability. A filamentary conductive path is formed between the electrodes of the variable resistance element. The resistance of the conductive path is small during set and a relatively large current flows in the conductive path. The resistance of the conductive path becomes high during reset and a relatively small current flows in the conductive path. When the difference between the currents flowing in the conductive path during set and reset increases, the stress generated in the conductive path increases and the deterioration of the conductive path is accelerated. Therefore, in order to improve the durability (number of times) of rewriting of the variable resistance element, it is desirable to reduce the difference between the currents that flow during set and reset.

Figure 5A:
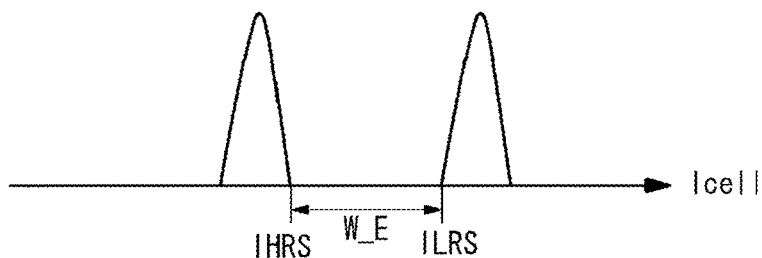
FIG. 5(A), FIG. 5(B), and FIG. 5(C) are diagrams showing examples of profiles of a current flowing through a variable resistance element at the time of set/reset.
Figure 5B:
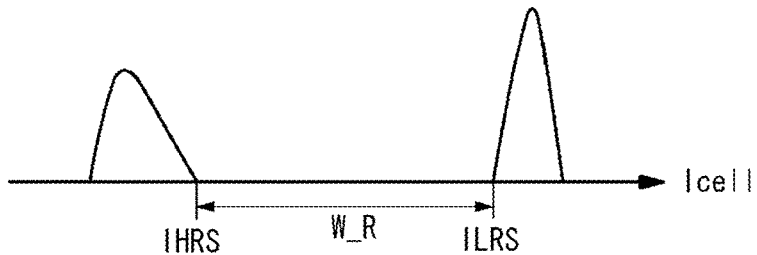
Figure 5C:
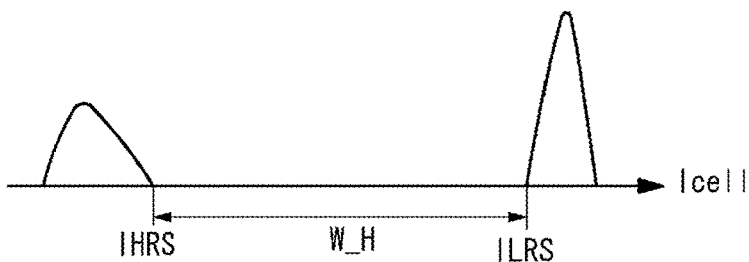

FIG. 5(A), FIG. 5(B), and FIG. 5(C) show the profiles of the current Icell flowing through the variable resistance element during set/reset. FIG. 5(A) is an example of the distribution of the current Icell during set/reset when it is oriented to improving the endurance characteristic. IHRS is the upper limit value of the current distribution during reset and ILRS is the lower limit value of the current distribution during set. When it is oriented to improving the endurance characteristic, data is written based on a write condition that makes the window (width) W_E between IHRS and ILRS as narrow as possible.

The retention characteristic represents the time that data can be held by the variable resistance element, and the retention-related command is a command oriented to improving such retention time. When rewriting is repeatedly performed on the variable resistance element and the conductive path between the electrodes of the variable resistance element changes, the current flowing through the variable resistance element during set and the current flowing through the variable resistance element during reset change. The sense amplifier 160 compares the current that flows during set/reset (or the voltage corresponding to the current) with the reference value and senses the data held in the variable resistance element. However, when the current difference between set/reset becomes small, it is difficult to sense the data. Therefore, in order to improve the retention characteristic, it is necessary to increase the current difference during set/reset, compared with the case of improving the endurance characteristic.

FIG. 5(B) shows an example of the distribution of the current Icell during set/reset when it is oriented to improving the retention characteristic. As shown in the figure, when it is oriented to improving the retention characteristic, data is written based on a write condition that makes the window (width) W_R between IHRS and ILRS satisfy W_R>W_E.

The high-speed reading characteristic represents the speed of reading the data held in the variable resistance element, and the high-speed reading-related command is a command oriented to increasing the reading speed of the data. The sense amplifier 160 detects the current flowing through the variable resistance element during set/reset, but if the current difference is large, the detection speed also increases. Therefore, in order to increase the reading speed, the current difference during set/reset is increased, compared with the case of improving the retention characteristic.

FIG. 5(C) shows an example of the distribution of the current Icell during set/reset when it is oriented to increasing the reading speed. As shown in the figure, when increasing the reading speed, data is written based on a write condition that makes the window (width) W_H between IHRS and ILRS satisfy W_H>W_R.

Figures 6, 7:
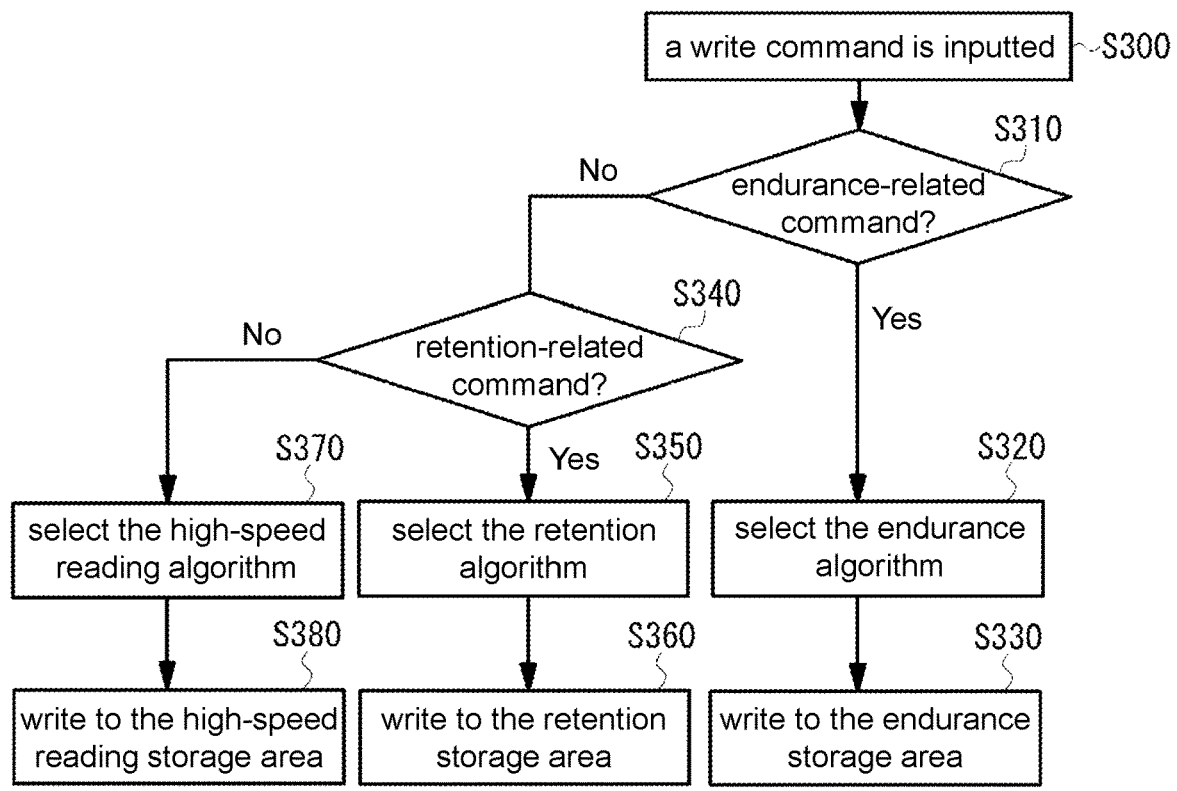
FIG. 6 is a flowchart illustrating a write operation according to the first embodiment of the disclosure.
FIG. 7 is a diagram showing an example of a write condition according to an embodiment of the disclosure.

FIG. 6 is a flowchart illustrating the write operation of the present embodiment. When the write command, an address, and data are inputted to the variable resistance memory 100 from the outside (S300), the row decoder 120 selects the word line based on the row address Ax and thereby turns on the access transistor, and the column decoder 130 selects the bit line BL/source line SL based on the column address Ay. The control circuit 150 determines whether the write command corresponds to the endurance-related command (S310). If the write command is the endurance-related command, the control circuit 150 selects the endurance algorithm (S320) and writes data in accordance with the write condition specified by the algorithm.

FIG. 7 shows an example of the write condition. The write condition specifies the condition of a write pulse to be applied to the variable resistance element during set or reset. The write condition is, for example, stored in advance in any memory area as setting information. The condition of the write pulse includes a pulse width and/or an amplitude level of the pulse, and when the endurance algorithm is selected, write pulse widths T_ES and T_ERS of set/reset and/or amplitude levels V_ES and V_ERS of the write pulse are set. In addition, the write condition can include the voltage to be applied to the word line (access transistor) and makes it possible to prevent an excessive current from flowing through the variable resistance element by adjusting the voltage. The variable resistance memory 100 includes an internal voltage generation circuit that includes a charge pump or the like for cases when a voltage higher than the power source voltage Vcc supplied from the outside is required. The voltage generated by the internal voltage generation circuit is supplied to the row decoder 120, the column decoder 130, and the write driver/read bias circuit 170.

For writing during set, the write driver/read bias circuit 170 applies a write pulse having a pulse width specified by T_ES and an amplitude specified by V_ES to a global bit line GBL between the global bit line GBL and a global source line GSL. The write pulse applied to the global bit line GBL is further applied to the bit line BL selected by the column decoder 130. For writing during reset, the polarity is inverted with respective to set and the write driver/read bias circuit 170 applies a write pulse having a pulse width specified by T_ERS and an amplitude specified by V_ERS to the global source line GSL. The write pulse applied to the global source line GSL is further applied to the source line SL selected by the column decoder 130.

Figure 8:
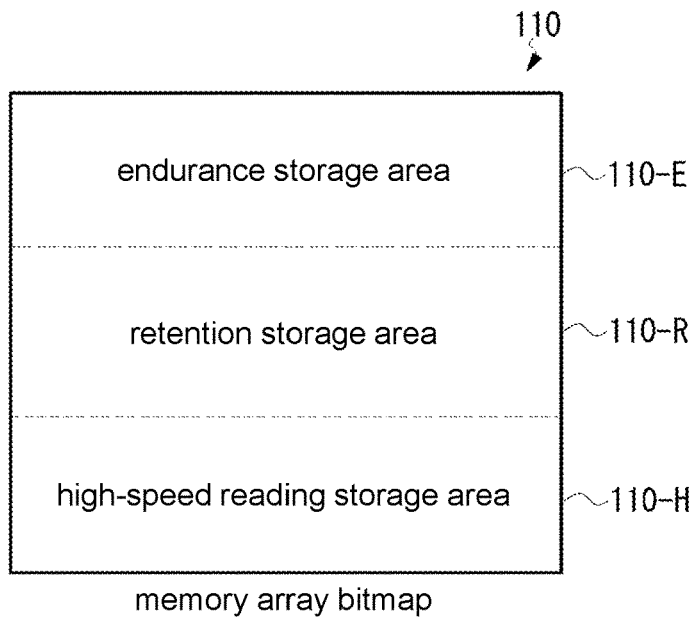
FIG. 8 is a diagram showing an example of a storage area set in a memory cell array region according to an embodiment of the disclosure.

In accordance with the write condition for endurance as described above, the control circuit 150 writes data to the variable resistance element selected by the address inputted from the outside (S330). Here, in an embodiment, the memory array 110 is divided into an endurance storage area 110-E, a retention storage area 110-R, and a high-speed reading storage area 110-H, as shown in FIG. 8, and the control circuit 150 writes data to the storage area corresponding to the write command. In other words, when the endurance-related command is inputted and the command is executed, the control circuit 150 selects the endurance storage area 110-E and writes data to the endurance storage area 110-E in accordance with the inputted address. Here, the memory array 110 is divided into three storage areas as an example. Nevertheless, the memory array 110 may have three memory planes or memory banks, and the memory planes may be assigned with the endurance storage area, the retention storage area, and the high-speed reading storage area respectively to be selected according to the write command.

Furthermore, if the write command is not the endurance-related command (S310), whether the write command is the retention-related command is determined (S340). If the write command is the retention-related command, the control circuit 150 selects a retention algorithm (S350) and writes data to the retention storage area 110-R in accordance with the write condition (T_RS, T_RRS, V_RS, V_RRS) specified by the retention algorithm shown in FIG. 7 (S360).

If the write command is not the retention-related command, the write command is determined to be the high-speed reading-related command, and the control circuit 150 selects a high-speed reading algorithm (S370) and writes data to the high-speed reading storage area 110-H in accordance with the write condition (T_HS, T_HRS, V_HS, V_HRS) specified by the high-speed reading algorithm shown in FIG. 7 (S380).

Thus, in the endurance storage area 110-E, the data oriented to improving the endurance characteristic (that is, the data having the distribution of the window W_E as shown in FIG. 5(A)) is stored. In the retention storage area 110-R, the data oriented to improving the retention characteristic (that is, the data having the distribution of the window W_R as shown in FIG. 5(B)) is stored. In the high-speed reading storage area 110-H, the data oriented to high-speed reading (that is, the data having the distribution of the window W_H as shown in FIG. 5(C)) is stored.

In the read operation, when a read command and an address are inputted from the outside, the control circuit 150 reads data from the memory cell array 110 according to the inputted address. In an embodiment, the control circuit 150 can determine whether the storage area corresponding to the inputted address is for endurance, retention, or high-speed reading, and based on the determination result, adjust the reference value of the sense amplifier 160 (for comparison with the detected current or voltage). For example, if the data is read from the endurance storage area 110-E, an appropriate reference value is set in the range of the window W_E. If the data is read from the retention storage area 110-R, an appropriate reference value is set in the range of the window W_R. If the data is read from the high-speed reading storage area 110-H, an appropriate reference value is set in the range of the window W_H. However, when one reference value can be used for any of the windows W_E, W_R, and W_H, adjustment of the reference value is unnecessary. Additionally, in the case where the memory cell array has a configuration of 2T×2R, since the sense amplifier 160 detects a difference signal, the reference value is not required in the first place.

Next, the second embodiment of the disclosure will be described. The first embodiment illustrates an example that the data is written by changing the write condition or the write characteristic according to the type of the write command inputted from the outside. In the second embodiment, however, the data is written by changing the write condition or the write characteristic according to the address inputted from the outside. In this case, the host device connected to the variable resistance memory 100 already acquires the address areas of the endurance storage area 110-E, the retention storage area 110-R, and the high-speed reading storage area 110-H set in the memory cell array 110.

Figure 9:
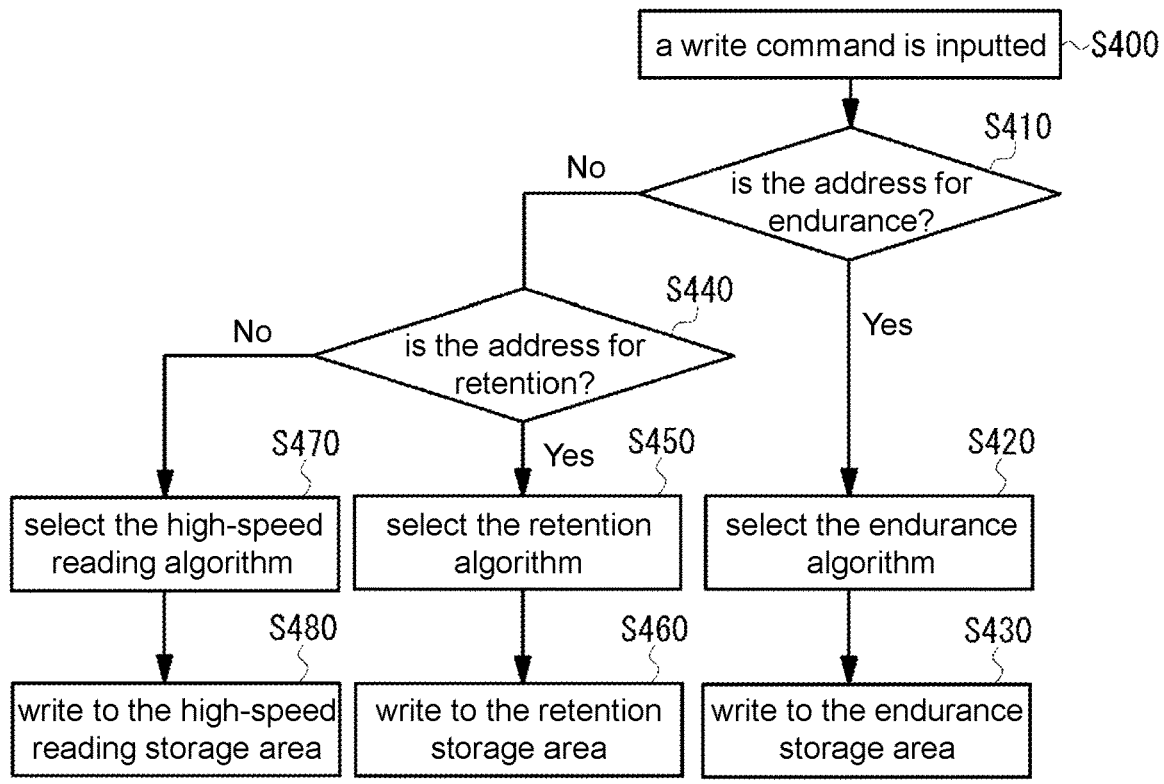
FIG. 9 is a flowchart illustrating a write operation according to the second embodiment of the disclosure.

FIG. 9 shows a flow of the write operation according to the second embodiment. When a write command is inputted from the outside (S400), the control circuit 150 determines whether the address inputted from the outside corresponds to the endurance storage area 110-E (S410). If the address inputted from the outside corresponds to the endurance storage area 110-E, the control circuit 150 selects the endurance algorithm (S420) and writes the data to the endurance storage area 110-E (S430). On the other hand, if the inputted address does not correspond to the endurance storage area 110-E, the control circuit 150 determines whether the inputted address corresponds to the retention storage area 110-R (S440). If the inputted address corresponds to the retention storage area 110-R, the control circuit 150 selects the retention algorithm (S450) and writes the data to the retention storage area 110-R (S460). Furthermore, if the inputted address does not correspond to the retention storage area 110-R, the control circuit 150 determines that it is oriented to high-speed reading, and the control circuit 150 selects the high-speed reading algorithm (S470) and writes the data to the high-speed reading storage area 110-H (S480).

As described above, according to the second embodiment, data corresponding to the orientation of the write command can be written based on the address associated with the memory cell array without inputting multiple types of write commands from the outside as in the first embodiment. The second embodiment is like generating a reliability-oriented or reading-oriented command internally based on the inputted address.

Next, the third embodiment of the disclosure will be described. The third embodiment relates to a function of refreshing the data stored in the storage area of the memory cell array. When the conductive path of the variable resistance element deteriorates with the increase of the number of times of data rewriting, the current during set/reset fluctuates. In particular, in the case where the variable resistance element is oriented to the endurance characteristic, because the window W_E is narrow, there is a possibility that data cannot be read accurately.

Figures 10, 11A, 11B:
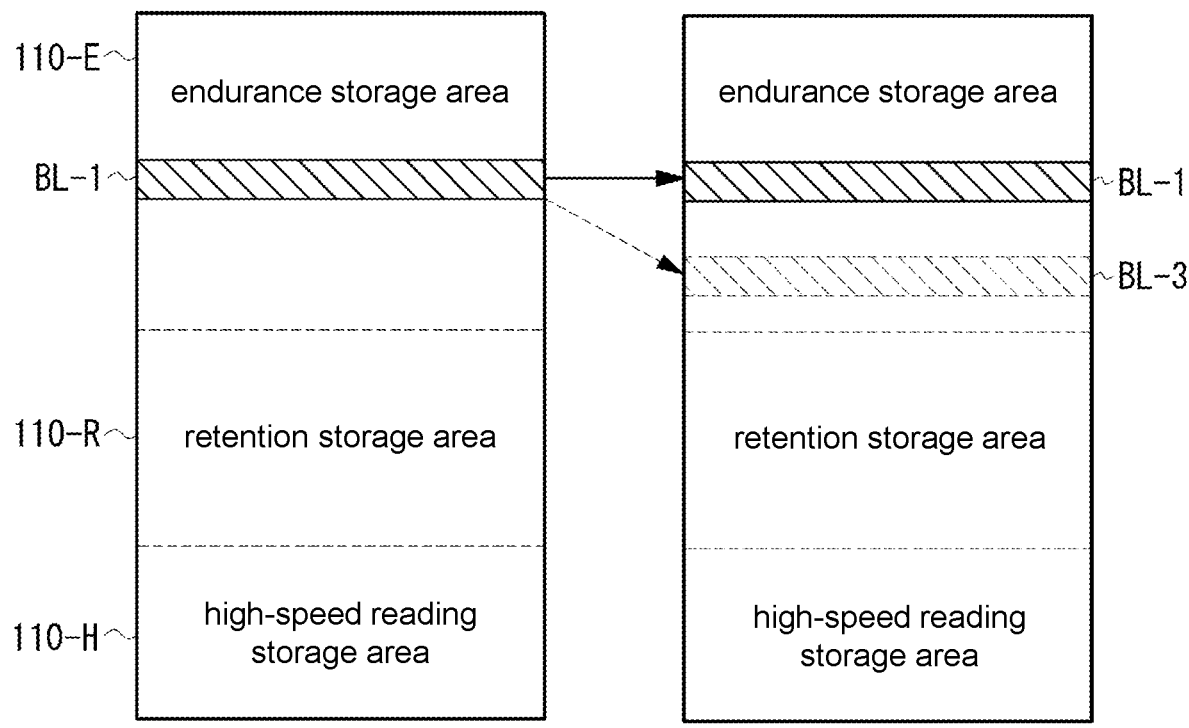
FIG. 10 is a diagram illustrating setting of a refresh flag according to the third embodiment of the disclosure.
FIG. 11(A) and FIG. 11(B) are diagrams illustrating a refresh operation according to the third embodiment of the disclosure.

In an embodiment, the control circuit 150 has a prediction element for predicting an indication that the stored data is invalid. The prediction element stores the number of times of rewriting of the variable resistance element, stores the number of errors of ECC during data reading, stores the number of failures during verification, and counts the time the data is held, for example. Since prediction in the unit of memory cells is very complicated, one storage area is divided into a plurality of blocks, for example, to predict the indication that data is invalid in the unit of blocks. The prediction element includes a table for monitoring the state of the memory cell array in the background processing. For example, as shown in FIG. 10, when a block BL_1 where the indication of invalid data is predicted is found, a flag is set from data "0" to "1". Then, refresh is performed on the block BL_1 where the flag is set to "1".

The control circuit 150 refreshes the block where the indication of invalid data is predicted. For example, as shown in FIG. 11(A), if an indication that the data of the block BL_1 of the endurance storage area 110-E is invalid is predicted, the control circuit 150 rewrites the block BL_1 with the same data, as shown in FIG. 11(B). Alternatively, the control circuit 150 may rewrite the same data to a block BL_n in an area different from the block BL_1. In this case, the block BL_n is an unused area that has not been written with data.

In another embodiment, the control circuit 150 may form the block before refreshing. During the forming, the data stored in the block is temporarily saved in another storage area.

In yet another embodiment, the control circuit 150 may refresh in response to a user command. When a refresh command is inputted from the outside, the control circuit 150 starts refreshing the block where the flag is set to "1" as shown in FIG. 10. Alternatively, when the refresh command is inputted, the control circuit 150 may refresh a selected storage area, such as all the blocks of the endurance storage area 110-E. Alternatively, when a block address is inputted together with the refresh command, the control circuit 150 may refresh the block corresponding to the block address.

Next, the fourth embodiment of the disclosure will be described. The fourth embodiment relates to a function of transferring data stored in a storage area of the memory cell array to another storage area. Information on the storage area set in the memory cell array 110 is known on the side of the host device, and the host device outputs a command of data transfer, a moving source, and an address relating to the moving source to the variable resistance memory 100. The control circuit 150 executes the data transfer in response to the inputted command and address.

Figure 12:
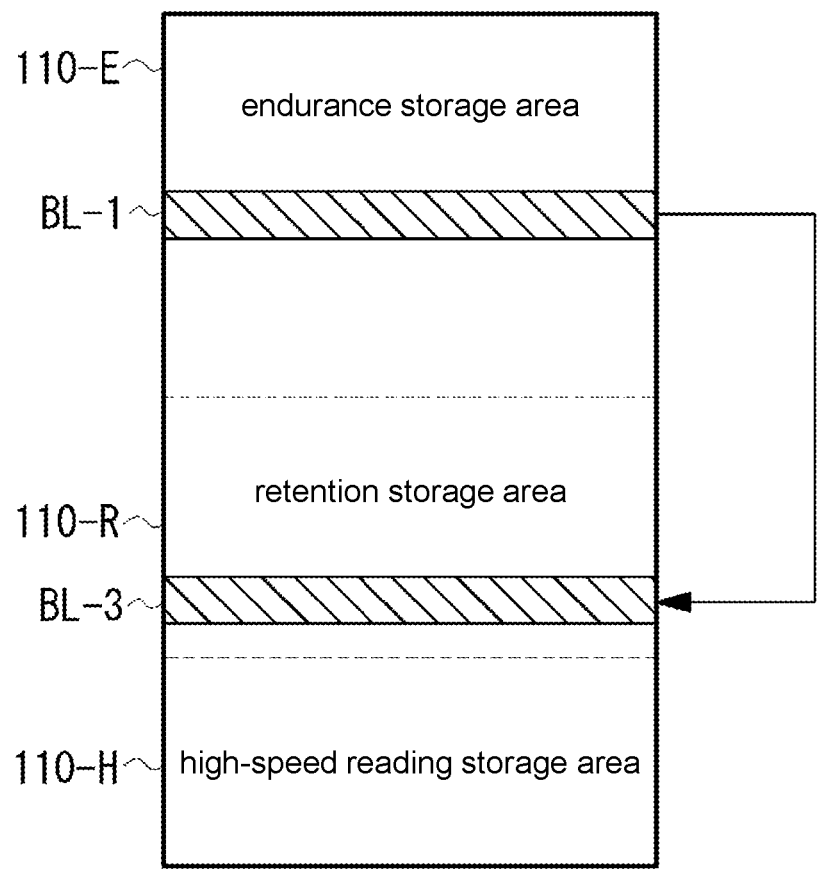
FIG. 12 is a diagram illustrating an operation of data movement according to the fourth embodiment of the disclosure.

For example, as shown in FIG. 12, in the case of transferring the data of the block BL_1 of the endurance storage area 110-E to the block BL_3 of the retention storage area 110-R, the control circuit 150 reads the data of the block BL_1 and writes the read data to the block BL_3 of the retention storage area 110-R in accordance with the same write condition as for executing the retention-related command.

According to the fourth embodiment, the reliability condition or the performance of the data stored in the memory cell array can be changed arbitrarily.

The above embodiments illustrate the endurance-related command, the retention-related command, and the high-speed reading-related command, but these are only examples. According to the disclosure, it is possible to use write commands oriented to other reliability or performances (such as the disturb characteristic, etc.). Moreover, although the above embodiments illustrate that the variable resistance memory corresponds to three types of write commands, the disclosure may also correspond to two or four or more types of write commands. Furthermore, the disclosure is also applicable to a case where the variable resistance memory 100 is embedded in a semiconductor device including various functions.

Although exemplary embodiments of the disclosure have been described in detail above, the disclosure is not limited to specific embodiments, and various modifications and changes may be made within the scope of the disclosure defined in the claims.

What is claimed is:

1. A semiconductor memory device, comprising:
   a memory array comprising a reversible and non-volatile variable resistance element, wherein a plurality of storage areas corresponding to a plurality of write conditions are set in the memory array; and
   a writing element writing data to the storage area corresponding to the write condition selected according to a type of a write command, wherein the type of the write command comprises an endurance command for increasing a number of rewriting, a retention command for increasing a retention time, and a high-speed reading command for increasing a reading speed,
   wherein the plurality of storage areas comprises an endurance storage area corresponding to the endurance command and an endurance write condition, a retention storage area corresponding to the retention command and a retention write condition and a high-speed reading storage area corresponding to the high-speed reading command and a high-speed reading write condition,
   wherein the writing element transfers the data from the endurance storage area to the retention storage area according to the retention command and the retention write condition,
   wherein the storage area corresponding to the writing condition stores the data having a window width corresponding to the writing condition, and the window width is a difference between an upper limit value of a current distribution during a reset of the reversible and non-volatile variable resistance element and a lower limit value of the current distribution during a set of the reversible and non-volatile variable resistance element, wherein the plurality of storage areas respectively stores data with different window widths.

2. The semiconductor memory device according to claim 1, further comprising a storage element storing an algorithm specifying the write condition, wherein the writing element selects the algorithm corresponding to the write command.

3. The semiconductor memory device according to claim 1, wherein the write command comprises a command oriented to improving reliability, or the write command comprises a command oriented to improving a read operation speed.

4. The semiconductor memory device according to claim 1, further comprising a refresh element refreshing data stored in a selected storage area of the memory array.

5. The semiconductor memory device according to claim 4, wherein the refresh element comprises rewriting the same data.

6. The semiconductor memory device according to claim 4, wherein the refresh element is executed in response to a command inputted from outside.

7. The semiconductor memory device according to claim 1, further comprising a moving element moving data stored in a certain storage area of the memory array to another storage area.

8. The semiconductor memory device according to claim 7, wherein the moving element is executed in response to a command inputted from outside.

9. The semiconductor memory device according to claim 1, wherein he write condition comprises a write pulse time applied to the variable resistance element that is selected, or the write condition comprises a voltage level of a write pulse applied to the variable resistance element that is selected.

10. The semiconductor memory device according to claim 4, wherein the refresh element comprises a detection element detecting an indication that the data stored in the storage area is invalid, and executes refreshing in response to a detection result.

11. A semiconductor memory device, comprising:
    a memory array comprising a reversible and non-volatile variable resistance element, wherein a plurality of storage areas corresponding to a plurality of write conditions are set in the memory array, wherein the write conditions comprises an endurance write condition for increasing a number of rewriting, a retention write condition for increasing a retention time, and a high-speed reading write condition for increasing a reading speed; and
    a writing element writing data to the storage area corresponding to the write condition selected according to an address inputted from outside during a write operation,
    wherein the plurality of storage areas comprises an endurance storage area corresponding to the endurance command and an endurance write condition, a retention storage area corresponding to the retention command and a retention write condition and a high-speed reading storage area corresponding to the high-speed reading command and a high-speed reading write condition, wherein the writing element transfers the data from the endurance storage area to the retention storage area according to the retention command and the retention write condition, wherein the storage area corresponding to the writing condition stores the data having a window width corresponding to the writing condition, and the window width is a difference between an upper limit value of a current distribution during a reset of the reversible and non-volatile variable resistance element and a lower limit value of the current distribution during a set of the reversible and non-volatile variable resistance element, wherein the plurality of storage areas respectively stores data with different window widths.

12. The semiconductor memory device according to claim 11, further comprising a refresh element refreshing data stored in a selected storage area of the memory array.

13. The semiconductor memory device according to claim 12, wherein the refresh element comprises rewriting the same data.

14. The semiconductor memory device according to claim 12, wherein the refresh element is executed in response to a command inputted from outside.

15. The semiconductor memory device according to claim 11, further comprising a moving element moving data stored in a certain storage area of the memory array to another storage area.

16. The semiconductor memory device according to claim 15, wherein the moving element is executed in response to a command inputted from outside.

17. The semiconductor memory device according to claim 11, wherein the write condition comprises a write pulse time applied to the variable resistance element that is selected, or the write condition comprises a voltage level of a write pulse applied to the variable resistance element that is selected.

18. The semiconductor memory device according to claim 12, wherein the refresh element comprises a detection element detecting an indication that the data stored in the storage area is invalid, and executes refreshing in response to a detection result.

* * * * *